United States Patent [19]

Eguchi et al.

[11] Patent Number: 4,999,909
[45] Date of Patent: Mar. 19, 1991

[54] ELECTRIC COMPONENT MOUNTING APPARATUS

[75] Inventors: Takao Eguchi, Nishinomiya; Motoshi Shitanda, Toyonaka; Makito Seno, Nakakoma; Wataru Hirai, Hirakata, all of Japan

[73] Assignee: Matsushita Electric Industrial Co., Ltd., Osaka, Japan

[21] Appl. No.: 513,817

[22] Filed: Apr. 25, 1990

[30] Foreign Application Priority Data

Apr. 27, 1989 [JP] Japan .................................. 1-108802

[51] Int. Cl.$^5$ ................................................ H05K 3/30
[52] U.S. Cl. ............................................ 29/740; 29/759
[58] Field of Search .................... 29/740, 759, 743, 840

[56] References Cited

FOREIGN PATENT DOCUMENTS

62-140499 11/1987 Japan .

Primary Examiner—Carl E. Hall
Attorney, Agent, or Firm—Wenderoth, Lind & Ponack

[57] ABSTRACT

A component mounting apparatus which comprises at least first and second component supply assemblies mounted on respective movable tables that are mounted on a common track for movement therealong. The apparatus also comprises at least one positioning device for positioning a printed circuit board on which components are desired to be mounted; at least one component mounting unit for receiving a component at a predetermined position of the component supply assembly and mounting the component onto the support member; and a table moving mechanism which is selectively connectable with one of the first and second movable tables for driving the movable table along the common track. The table moving mechanism comprises a fixed shaft member disposed laterally of and extending parallel to the common track, a drive unit mounted on the fixed shaft member for movement therealong between opposite ends of the fixed shaft member, and a releasable coupling for selectively connecting and disconnecting the drive unit with and from any one of the movable tables, respectively.

2 Claims, 5 Drawing Sheets

ELECTRIC COMPONENT MOUNTING APPARATUS

BACKGROUND OF THE INVENTION

1. Field of the Invention

The present invention relates to a component mounting apparatus which is used in, for example, automatically successively picking up electric component parts by means of at least one suction nozzle and then mounting electric component parts onto a printed circuit board.

2. Description of the Prior Art

A component mounting apparatus for automatically successively mounting electric component parts onto a printed circuit board has been well known which comprises a plurality of component supply units accommodating respective batches of electric and/or electronic component parts: a movable table on which the component supply units are mounted side-by-side in a row, said movable table being supported for movement in a direction parallel to the row of the component supply units so that at a predetermined supply position an electronic component in a selected one of the component supply units can be taken out from such selected component supply unit: a positioning means for positioning a printed circuit board so that a portion of the printed circuit board onto which the electronic component is desired to be mounted can be aligned with a predetermined mounting position: and a component mounting means capable of retaining the electronic component at the predetermined supply position and then mounting the electronic component onto that portion of the printed circuit board at the predetermined mounting position.

In this component mounting apparatus, the use of a plurality of movable tables is feasible in order that the apparatus can be used for mounting a number of different component parts onto a single printed circuit board, that a loss of time which would occur when the component supply units are replaced with change in type of printed circuit boards may be reduced by reducing the number of changes required, and that a high speed movements can be achieved by reducing a load which would be imposed on the movable table.

In view of the foregoing, the Japanese Laid-open Patent Publication No. 62-140499, published in 1987, discloses a component mounting apparatus which comprises a pair of movable tables supported for movement independent of each other along a common path of movement thereof: a plurality of component supply units mounted on each of the movable tables: a drive unit for each movable table including a screw shaft extending parallel to the common path and a drive motor for driving the associated screw shaft: and internally threaded nuts threadingly mounted on the respective screw shafts and rigidly secured to respective undersurfaces of the movable tables, the movable tables being selectively utilized one at a time depending on conditions under which the component mounting is carried out.

The component mounting apparatus disclosed in the above mentioned publication has been found having some problems. Specifically, the drive unit including the screw shaft and the drive motor is employed for each movable table so that the movable tables can be moved independently of each other. Accordingly, the two screw shafts each having a substantial length corresponding to the stroke of movement of the associated movable table are required, resulting in an increase in manufacturing cost. Also, since each screw shaft for transmitting a driving torque has a substantial length as described previously, the screw shaft tends to undergo a fluctuating motion during the rotation thereof, and therefore, in order to minimize the angle of twist during the drive thereof, each screw shaft must have an increased diameter accompanied by an increase in weight thereof to such an extent as to result in an increase in inertia.

In a system wherein a ball screw is rotated, bearings at opposite ends of the ball screw are loaded to the limit of tolerance enough to result in a displacement in a direction parallel to the path of movement of the table during the drive of each movable table, posing various problems to the facilitation of a high speed component mounting.

The component mounting machine having two component mounting means is also well known. This type of component mounting machine is so designed that the two component mounting means can pick up respective identical components out from a component supply device provided with a single movable table in readiness for mounting on two mounting members which are subsequently moved by a single positioning means to a position above the respective mounting members. While this machine can mount two components simultaneously on a single printed circuit board, the realization of the high speed component mounting and the capability of handing different types of component parts are incompatible with each other.

SUMMARY OF THE INVENTION

The present invention has been devised with the foregoing taken into consideration and has for its primary object to provide an improved component mounting apparatus wherein, while a shaft member such as a ball screw is employed, any possible deformation of the shaft member during the drive thereof can be minimized and, at the same time, both a reduction in cost and a high speed component mounting can be accomplished.

Another important object of the present invention is to provide an improved component mounting apparatus of a type comprising two component mounting means, which is effective to mount different types of component parts at high speed.

In order to accomplish the above described objects, the present invention, there is provided a component mounting apparatus which comprises at least first and second component supply assemblies each including a plurality of juxtaposed component supply units: at least first and second movable tables for supporting thereof the respective first and second component supply assemblies, each of said first and second movable tables being movable in a direction parallel to the direction in which the component supply units of the associated component mounting assembly are juxtaposed; a common track along which any one of the first and second movable tables is moved: a positioning means for positioning a support member on which components are desired to be mounted; a component mounting means for receiving a component at a predetermined position of the component supply assembly and mounting the component onto the support member; and a table moving means selectively connectable with one of the first and second movable tables for driving the movable table along the common track.

The table drive means comprises a fixed shaft member disposed laterally of and extending parallel to the common track, a drive means mounted on the fixed shaft member for movement therealong between opposite ends of the fixed shaft member, and a releasable coupling means for selectively connecting and disconnecting the drive means with and from any one of the movable tables, respectively.

The number of each of the positioning means and the component mounting means employed in the foregoing component mounting apparatus may be plural.

According to the present invention, at least one pair of the movable tables are mounted on a common track for movement independent from each other and, therefore, any one of the movable tables can be selectively brought to the operative position depending on the necessity. As a result thereof, the weight of each of the movable tables can be reduced, enabling the component mounting operation to be accomplished at high speed. Also, replacement of the component mounting assembly with another one is possible while the associated movable table carrying such component mounting assembly is held in the stand-by position and, therefore, the loss of time which would otherwise occur incident to the replacement of the component mounting assembly and/or the replacement of the component parts accommodated in the respective component mounting assembly can be advantageously minimized. Moreover, since the movement of each of the movable tables is accomplished by moving the drive means, then coupled with such movable table along the fixed shaft member, the necessity of driving the relatively heavy shaft hitherto required is eliminated and, therefore, the movable tables can be driven at high speed with inertia reduced and without accompanying a fluctuation of the shaft member.

Also, in the case of the use of the plural positioning means and the plural component mounting means, arrangement is made to connect the drive means with two or more of the plural movable tables for moving the latter. In this case, it is possible to mount different component parts from the plural mounting means onto the different support members enabling the apparatus to be operable with a relatively large number of different types of component parts.

BRIEF DESCRIPTION OF THE DRAWINGS

These and other objects and features of the present invention will become clearly understood from the following description taken in conjunction with preferred embodiments thereof with reference to the accompanying drawings, in which.

DETAILED DESCRIPTION OF THE EMBODIMENTS

Before the description of the present invention proceeds, it is to be noted that like parts are designated by like reference numerals throughout the accompanying drawings.

Referring first to FIGS. 1 to 5 showing one preferred embodiment of the present invention, reference numeral 1 represents a pair of component supply assemblies each including a plurality of groups, for example, two groups, of juxtaposed component supply units 2. As will be described later, each component supply assembly 1 is so designed that the component supply units 2 of the corresponding group can be selectively brought one at a time to a predetermined component supply station 1a. Each of the component supply units 2 has mounted thereon a respective strip of taped components which are removably supported on a tape in a row and is so designed that the taped components can be successively supplied towards a take-out position 2a defined at one end of the respective component supply unit 2.

Figure 1:
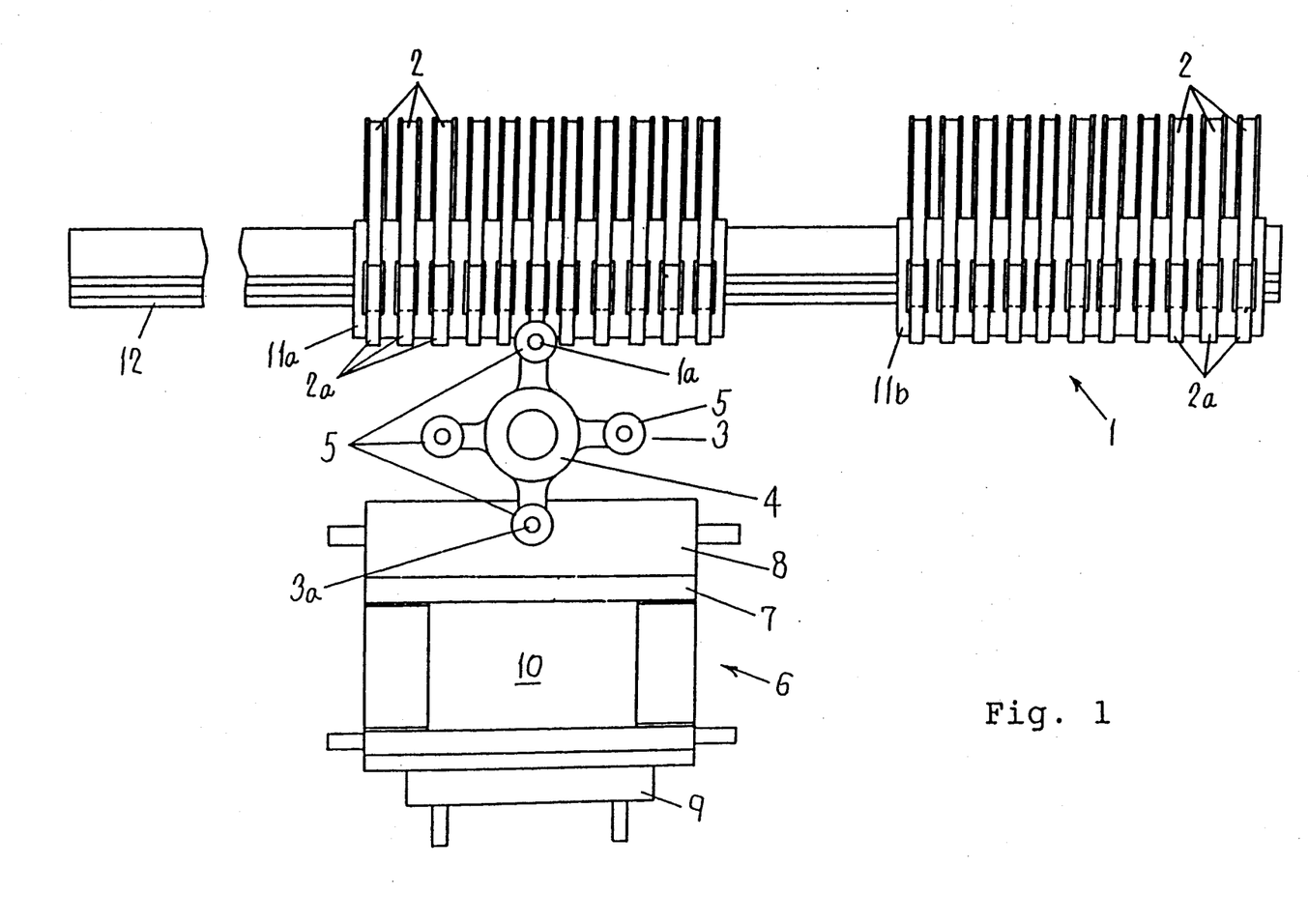
FIG. 1 is a schematic top plan view of a component mounting apparatus according to one preferred embodiment of the present invention.

Reference numeral 3 represents a turret-type component mounting unit which comprises a rotary table 4 supported on an axis for intermittent rotation about such axis and a plurality of, for example, four, mounting heads 5 carried by the rotary table 4. As far as the four mounting heads 5 are utilized, the rotary table can be angularly moved 90° during each intermittent rotation with the mounting heads 5 successively brought to the component supply position 1a and a component mounting position 3a. Each of the mounting heads 5 includes a suction nozzle (not shown) supported for movement up and down, said suction nozzle being selectively lowered and raised at the component supply position 1a. The raise of each suction nozzle takes place after the component parts picked up by the respective suction nozzle has been released therefrom.

Reference numeral 0 represents a positioning unit for positioning a printed circuit board 10 onto which the component parts are to be mounted successively. This positioning unit 0 comprises an X-axis table 8 supported for movement in an X-axis direction, a fixture means 7 mounted on the X-axis table for fixedly supporting at a predetermined position the printed circuit board 10 which has been supplied onto the positioning unit 0 from a supply means (not shown), and a Y-axis table 0 supported for movement in a Y-axis direction perpendicular to the X-axis direction and on which the X-axis table 8 is mounted. This positioning unit 6 is so designed that a combined movement of the X-axis and Y-axis directions in respective directions perpendicular to each other can bring an arbitrary chosen portion of the printed circuit board 10 on the X-axis table 8 into alignment with the component mounting position 3a.

The details of each component supply assembly 1 will now be described with particular reference to FIGS. 2 to 4. The component supply units 2 constituting each component supply assembly 1 are mounted on a respective movable table 11a or 11b in side-by-side fashion. The movable tables 11a and 11b supporting thereon the respective groups of the component supply units 2 are in turn movably mounted on a common guide frame 12 extending in a direction parallel to the direction in which the component supply units 2 of each group are arranged. Each of opposite end portions of this guide frame 12 on respective sides of the component supply position 1a has a length corresponding to the sum of the respective lengths of the movable tables 11a and 11b as measured in a direction parallel to the guide frame 12 and, accordingly, when one of the movable tables 11a and 11b is driven along the guide frame so as to bring one of the component supply units 2 in one group to the component supply position 1a, the other of the movable tables 11a and 11b can be held still at a stand-by position remote from the component supply position 1a. In other words, the movable tables 11a and 11b can be alternately driven from the stand-by position towards the operative position at which any one of the component supply units 2 in the associated group can be aligned with the component mounting position 1a.

Figure 2:
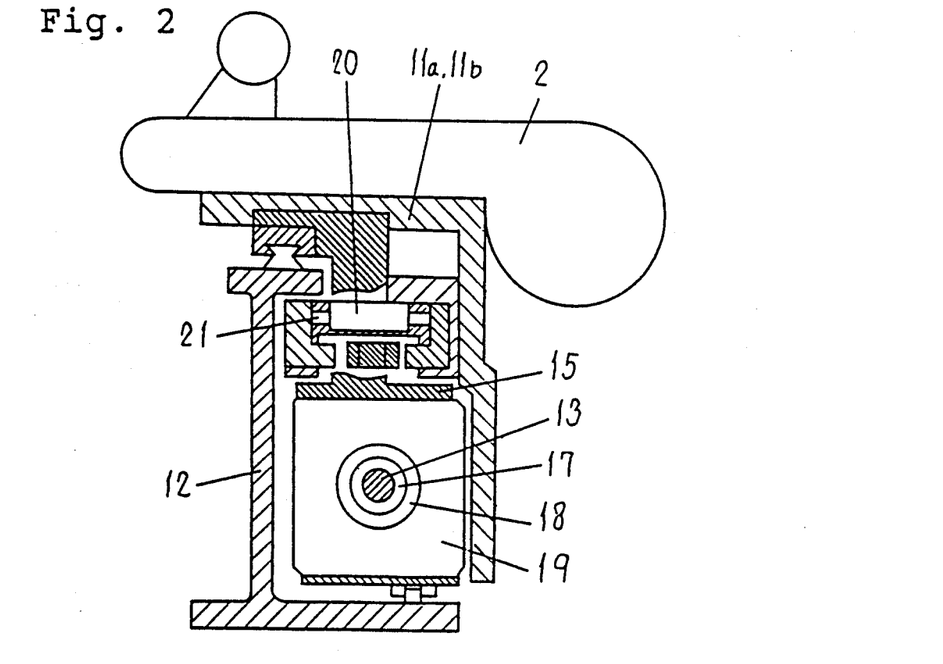
FIG. 2 is a longitudinal sectional view of the component mounting apparatus of FIG. 1.
Figure 3:
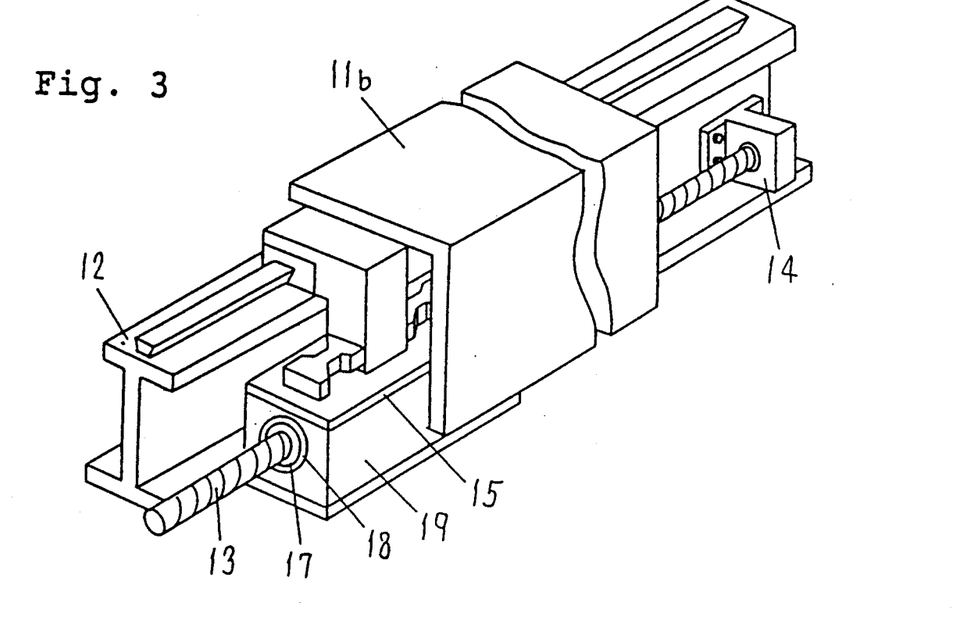
FIG. 3 is a perspective view of the component mounting apparatus of FIG. 1.

As best shown in FIGS. 2 and 3, the guide frame 12 carries a ball screw shaft 18 positioned laterally thereof and extending parallel thereto over the length of the guide frame 12, said ball screw shaft 13 having its opposite ends secured rigidly to the guide frame 12 through respective brackets 14.

A drive means 15 is mounted on the ball screw shaft 13, in a manner as will be described subsequently, for movement along the guide frame 12 and in a direction parallel to the direction in which each of the movable tables 11a and 11b is moved. This drive means 15 includes a drive motor 9 having a hollow rotor 18, and an internally threaded nut 17 incorporated within the hollow rotor 18 and threadingly mounted on the ball screw shaft 13.

Figure 4:
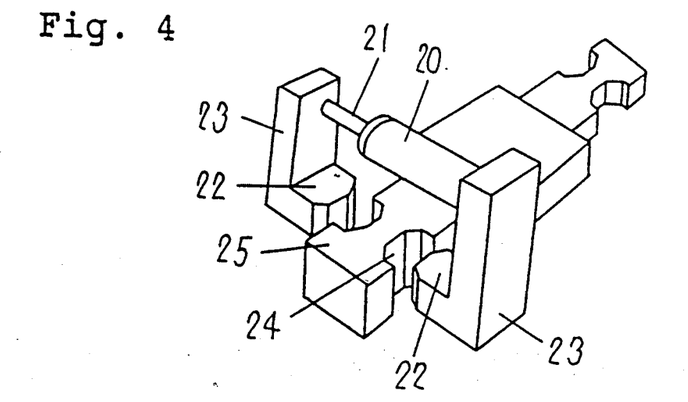
FIG. 4 is a perspective view of a drive means and a table catching means both used in the apparatus of FIG. 1.

As best shown in FIGS. 2 and 4, respective ends of the movable tables 11a and 11b which confront with each other are provided with respective cylinder devices 20 each including a piston rod 21 and also having a longitudinal axis lying perpendicular to the direction of movement of the associated movable table 11a or 11b. Catch members 23 each having a finger 22 formed integrally therewith are rigidly secured respectively to a free end of the piston rod 21 of each cylinder device 20 and a tail end of the associated cylinder device 20 as shown in FIG. 4. Cooperable with the catch members 20 associated with each cylinder device 20 is respective engagement recesses 24 defined in an associated engagement member 25 which is mounted on each of opposite ends of a body of the drive means 15.

Figure 5A:
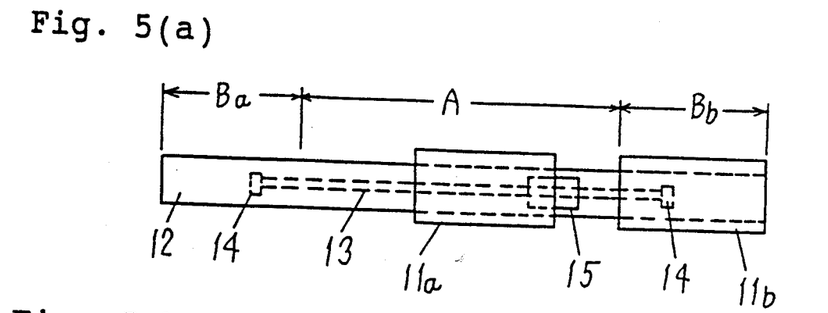
FIGS. 5(a) to 5(d) are schematic plan views showing the sequence of operation of the apparatus of FIG. 1.

Thus, it will readily be seen that, when the piston rod 21 of each cylinder device 20 is retracted into the associated cylinder device 20, the catch members 23 are coupled with the engagement member 2S with the fingers 22 engaged into the engagement recesses 24 thereby to bring one of the movable tables 11a and 11b selectively into an operative position. This means that the drive means 15 is coupled with the corresponding movable table 11a or 11b then brought into the operative position so that the both can move together along the guide frame 12. When and so long as one of the movable tables 11a and 11b is in the operative position, the other of the movable tables 11a and 11b is held at a stand-by position. As best shown in FIG. 5(a), the stroke over which the movable tables 22a and 22b are selectively moved is divided into three regions Ba, A and Bb, and the stand-by positions for the movable tables 22a and 11b are defined by the regions Ba and Bb, respectively, while the operative position for any one of the movable tables 11a and 11b is defined by the region A intermediate between the regions Ba and Bb. It is to be noted that each of the standby regions Ba and Bb extending a distance substantially equal to the length of the corresponding movable table 11a or 11b whereas the operative region A extends a distance substantially equal to or slightly greater than twice the length of any one of the movable tables 11a and 11b.

It is also to be noted that, when one of the movable tables 11a or 11b which is then held at the stand-by position Ba or Bb is desired to be brought into the operative position A, the drive means has to take the other of the movable tables 11b or 11a then in the operative position A to the stand-by position Bb or Ba. Disconnection of the drive means 15 with such other of the movable tables 11b or 11a takes place when such other of the movable tables 11b or 11a is brought to the stand-by position Bb or Ba, at which time the piston rod 21 of the associated cylinder device 20 projects outwards from such cylinder device 20 to allow the catch members 23 to separate away from the engagement member 25 with the fingers 22 consequently disengaged from the engagement recesses 24 while the drive means 15 can be moved towards such one of the movable tables 11a or 11b to fetch such one of the movable tables 11a or 11b as will subsequently described.

The operation of the component mounting apparatus of the above described construction will now be described with particular reference to FIG. 5 including FIGS. 5(a) to 5(d) that altogether show the sequence thereof. Let it be assumed that, as shown in FIG. 5(a). the movable table 11a is in the operative position A while the movable table 11b is held in the stand-by position Bb and that the printed circuit board 10 has been mounted and fixedly retained on the fixture means 7 on the positioning means 6.

Figure 5B:
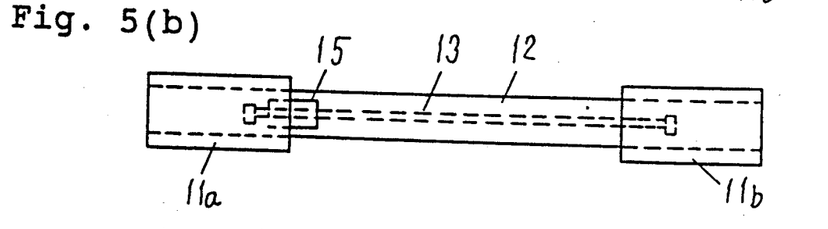
Figure 5C:
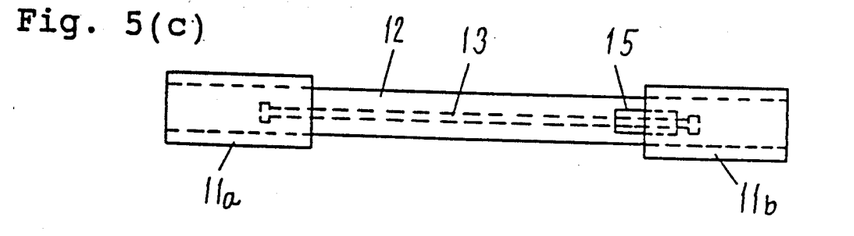
Figure 5D:
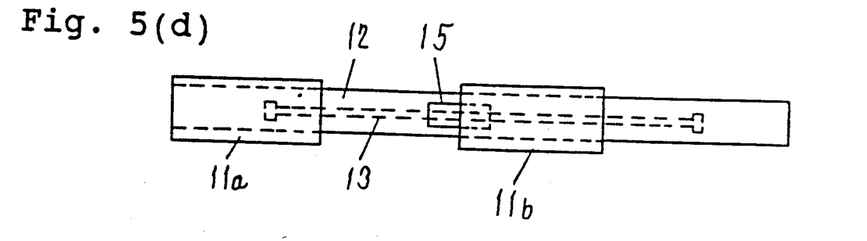

After the mounting of component parts supplied from the component supply units 2 carried by the movable table 11a have been successively mounted on the printed circuit board 10 and when component parts in the component supply units 2 carried by the movable table 11b are desired to be successively mounted on the same printed circuit board 10, the movable table 11a is moved to the stand-by position Ba along the guide frame 12 as shown in FIG. 5(b). followed by an actuation of the corresponding cylinder device 20 to project the piston rod 21 outwardly therefrom. Consequent upon the projection of the piston rod 21, the catch members 24 separate away from the engagement member 25 with the fingers 22 disengaged from the engagement recesses 24, allowing the drive means 15 to be moved towards the stand-by position Bb substantially as shown in FIG. 5(c). Upon arrival of the drive means 15 at the stand-by position Bb, the cylinder device 20 associated with the movable table 11b is actuated to retract the piston rod 21 inwardly thereinto so that the catch members 25 can be coupled with the engagement member 25 with the fingers 22 consequently engaged into the engagement recesses 24. Thus, the drive means 15 is operatively coupled with the movable table 11b then held in the stand-by position Bb and can take the movable table 11b to the operative position A when the drive means 15 is driven along the guide frame 12 as shown in FIG. 5(d) in readiness for the actual successive mounting of the component parts from the component supply units 2 on the movable table 11b.

According to the foregoing embodiment, since the movable tables 11a and 11b can be selectively brought into operation, each of the movable table may have a relatively small weight. Also, since the screw shaft 15 is fixedly supported by the guide frame 12 both the inertia and the possible fluctuation of the screw shaft which would take place when the screw shaft is driven about its longitudinal axis can be minimized, allowing the component mounting to be accomplished at high speed. Moreover, with respect to one of the movable tables which is held in the stand-by position, a replacement of the component supply units on the movable table in the stand-by position with different component supply units is possible, allowing the component mounting apparatus of the present invention to be utilizable with an increased number of different types of electric and/or electronic component parts. Hereinafter, the component mounting apparatus according to an alternative embodiment of the present invention will be described with reference to FIGS. 6 and 7.

Figure 6:
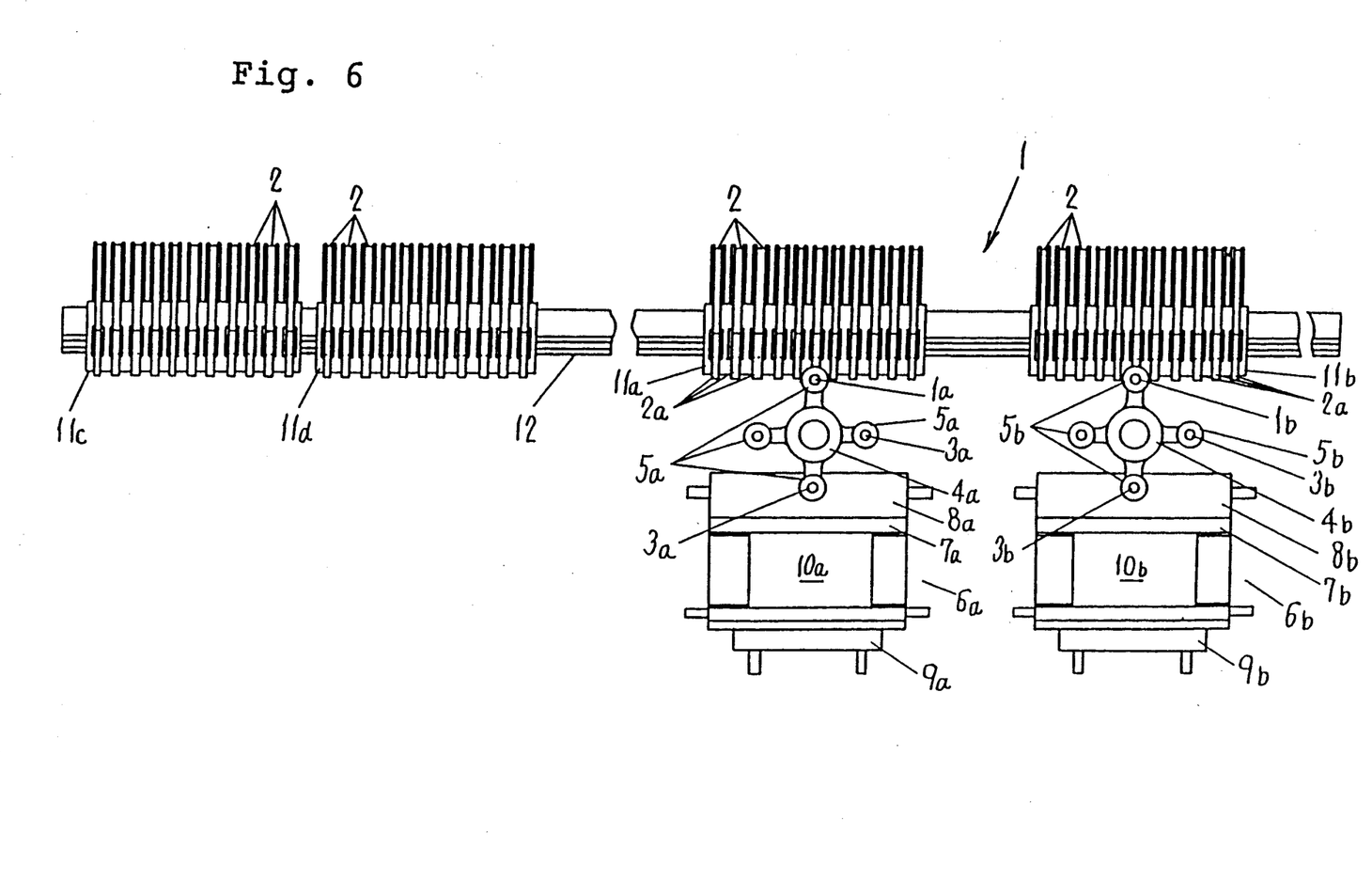
FIG. 6 is a schematic top plan view of the component mounting apparatus according to an alternative embodiment of the present invention.
Figure 7A:
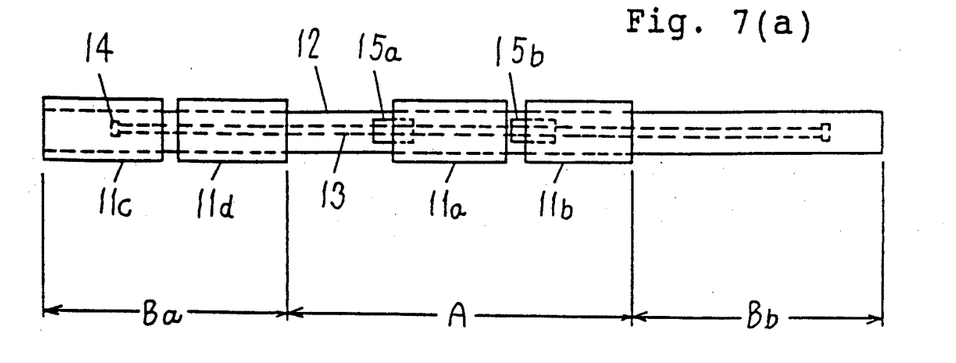
FIGS. 7(a) to 7(d) are schematic plan views showing the sequence of operation of the apparatus of FIG. 6.

In this alternative embodiment of the present invention, the four movable tables 11a, 11b, 11c and 11d each having the juxtaposed component supply units 2 mounted thereon are employed along with the employment of two turret-type component mounting units 3a and 3b. As shown in FIG. 6, the movable table 11a is paired with the next adjacent movable table 11b, and the movable table 11c is paired with the next adjacent movable table 11d. The movable tables 11a to 11d are mounted on the guide frame 12 for movement therealong so that any one of the component supply units 2 on each of the paired movable tables 11a to 11d can be brought to any one of first and second component mounting positions 1a and 1b. For this purpose, as best shown in FIG. 7(a), any one of the stand-by positions Ba and Bb defined at the opposite ends of the guide frame 12 extends a distance corresponding to the sum of the respective lengths of the two adjacent movable tables whereas the operative position A extends a distance corresponding to the sum of the respective lengths of the three consecutive movable tables. As is the case with the foregoing embodiment, each of the component supply units 2 on any one of the movable tables 11a to 11d has mounted thereon a respective strip of taped components which are removably supported on a tape in a row and is so designed that the taped components can be successively supplied towards a take-out position 2a defined at one end of the respective component supply unit 2.

Each of the turret-type component mounting units 3a and 3b comprises a rotary table 5a or 5b supported on an axis for intermittent rotation about such axis and a plurality of, for example, four, mounting heads 5a or 5b carried by the rotary table 4a or 4b. As far as the four mounting heads 5 for each component mounting unit 5a and 5b are utilized, the rotary table 4a or 4b can be angularly moved 90° during each intermittent rotation with the mounting heads 5a or 5b successively brought to the component supply position 1a or 1b and a component mounting position 5a or 5b. Each of the mounting heads 5a or 5b includes a suction nozzle (not shown) supported for movement up and down, said suction nozzle being lowered at the component supply position 1a or 1b for picking up the component parts and is then raised for transportation of the picked component parts towards the associated mounting position 5a or 5b. After the associated mounting head 5a or 5b has been rotated 180°, the suction nozzle is again lowered at the associated mounting position 5a or 5b to release the component therefrom for actual mounting onto the printed circuit board 10a or 10b and is then raised.

Reference numerals 6a and 6b represents respective positioning unit each operable to position the associated printed circuit board 10a or 10b onto which the component parts are to be mounted successively. Each of these positioning units 6a and 6b comprises an X-axis table 8a or 8b supported for movement in an X-axis direction, a fixture means 7a or 7b mounted on the X-axis table for fixedly supporting at a predetermined position the printed circuit board 10a or 10b which has been supplied onto the positioning unit 6a or 6b from a supply means (not shown). and a Y-axis table 9a or 9b supported for movement in a Y-axis direction perpendicular to the X-axis direction and on which the associated X-axis table 8a or 8b is mounted. Each positioning unit 6a or 6b is so designed that a combined movement of the X-axis and Y-axis directions in respective directions perpendicular to each other can bring an arbitrary chosen portion of the printed circuit board 10a or 10b on the associated X-axis table 8a or 8b into alignment with the component mounting position 5a or 3b.

As shown in FIG. 7, drive means 15a and 15b are drivingly mounted on the ball screw shaft 13 positioned laterally thereof and extending parallel thereto over the length of the guide frame 12 said drive means 15a and 15b being spaced a distance substantially equal to the span between the neighboring movable tables 11a and 11b or 11c and 11d. Each of these drive means 15a and 15b may be of a construction identical with that employed in the foregoing embodiment and is movable along the guide frame 12 and in a direction parallel to the direction in which each of the movable tables 11a to 11d is moved. Each drive means 15a and 15b includes a drive motor 10 having a hollow rotor 18, and an internally threaded nut 17 incorporated within the hollow rotor 18 and threadingly mounted on the ball screw shaft 13.

The operation of the component mounting apparatus according to the alternative embodiment of the present invention will now be described with reference to FIG. 7. Let it be assumed that, as shown in FIG. 7(a). the paired movable tables 11a and 11b are in the operative position A while the paired movable tables 11c and 11d are held in the stand-by position Ba and that the printed circuit boards 10a and 10b have been mounted and fixedly retained on the fixture means 7a and 7b on the respective positioning means 6a and 6b.

Figure 7B:
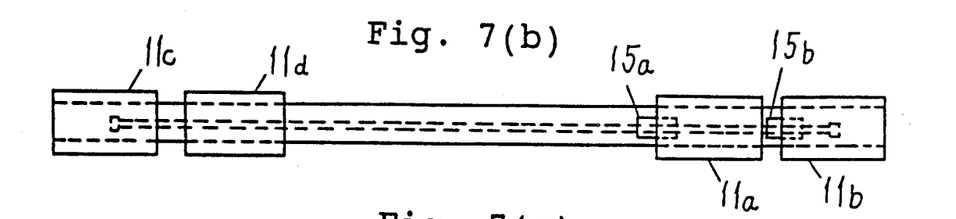
Figure 7C:
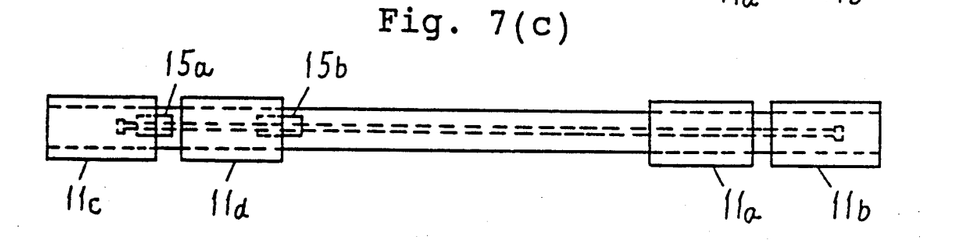
Figure 7D:
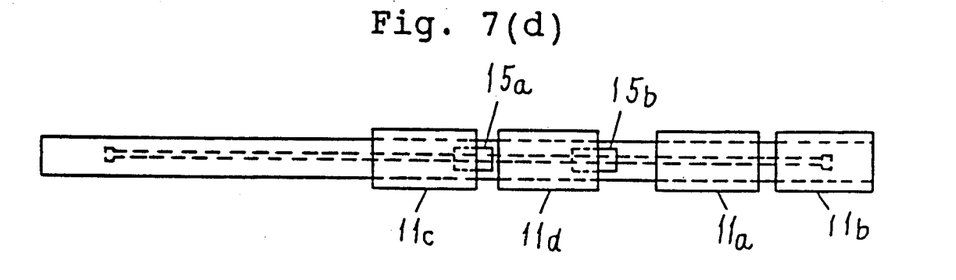

After the mounting of component parts supplied from the component supply units 2 carried by the paired movable tables 11a and 11b have been successively mounted on the respective printed circuit boards 10a and 10b and when component parts in the component supply units 2 carried by the paired movable table 11c and 11d are desired to be successively mounted on the same printed circuit boards 10a and 10b, the paired movable tables 11a and 11b are moved to the stand-by position Bb along the guide frame 12 as shown in FIG. 7(b), followed by an actuation of respective catch means to disconnect the movable means 15a and 15b from the paired movable tables 11a and 11b. Thereafter, the drive means 15a and 15b are moved towards the stand-by position Ba substantially as shown in FIG. 7(c). Upon arrival of the drive means 15a and 15b at the stand-by position 8a, the catch means are actuated to connect the drive means 15a and 15b with the paired movable tables 11c and 11d in the stand-by position 8a and can take the paired movable tables 11c and 11d to the operative position A when the drive means 15 is driven along the guide frame 12 a shown in FIG. 7(d) in readiness for the actual successive mounting of the component parts from the component supply units 2 on the respective paired movable table 11c and 11d.

It is to be noted that each of the catch means (not shown in FIGS. 6 and 7) for selectively connecting or disconnecting the drive means 15a and 15b with or from any ones of the paired movable tables 11a and 11b or 11c and 1d may be of a construction identical with or similar to that shown in and described with reference to FIG. 4.

Thus, according to the alternative embodiment of the present invention shown in and described with reference to FIGS. 6 and 7, both a plurality of positioning means, operable independent from each other, and a plurality of component supply assemblies, also operable independent from each other, are employed for a plurality of component mounting means 3a and 3b. Therefore, different types of component parts can be simultaneously mounted on different portions on the respective printed circuit boards, allowing the apparatus to be operable with the different types of the component parts t be mounted on the plural printed circuit boards. The component mounting means 5a and 5b may be so designed as to mount the respective component parts of different size and, in such case, the apparatus can be operable with the component parts of different size. Moreover, with respect to an arbitrarily chosen one of the movable tables, if the drive means are coupled therewith, the plural movable tables can be moved as desired depending on the necessity of supplement or supply of component parts and the mounting of the component parts.

From the foregoing description, it is clear that at least one pair of the movable tables are mounted on a common track for movement independent from each other and, therefore, any one of the movable tables can be selectively brought to the operative position depending on the necessity. As a result thereof, the weight of each of the movable tables can be reduced, enabling the component mounting operation to be accomplished at high speed. Also, replacement of the component mounting assembly with another one is possible while the associated movable table carrying such component mounting assembly is held in the stand-by position and, therefore, the loss of time which would otherwise occur incident to the replacement of the component mounting assembly and/or the replacement of the component parts accommodated in the respective component mounting assembly can be advantageously minimized. Moreover, since the movement of each of the movable tables is accomplished by moving the drive means, then coupled with such movable table, along the fixed shaft member, the necessity of driving the relatively heavy shaft hitherto required is eliminated and, therefore, the movable tables can be driven at high speed with inertia reduced and without accompanying a fluctuation of the shaft member.

Also, where the plural positioning means and the plural component mounting means are employed and arrangement has been made to connect the drive means with two or more of the plural movable tables for moving the latter, it is possible to mount different component parts from the plural mounting means onto the different support members such as printed circuit boards, enabling the apparatus to be operable with a relatively large number of different types of component parts.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A component mounting apparatus which comprises:
    at least first and second component supply assemblies each including a plurality of juxtaposed component supply units:
    at least first and second movable tables for supporting thereof the respective first and second component supply assemblies, each of said first and second movable tables being movable in a direction parallel to the direction in which the component supply units of the associated component mounting assembly are juxtaposed:
    a common track along which any one of the first and second movable tables is moved:
    a positioning means for positioning a support member on which components are desired to be mounted;
    a component mounting means for receiving a component at a predetermined position of the component supply assembly and mounting the component onto the support member; and
    a table moving means selectively connectable with one of the first and second movable tables for driving the movable table along the common track, said table moving means comprising a fixed shaft member disposed laterally of and extending parallel to the common track, a drive means mounted on the fixed shaft member for movement therealong between opposite ends of the fixed shaft member, and a releasable coupling means for selectively connecting and disconnecting the drive means with and from any one of the movable tables, respectively.

2. The apparatus as claimed in claim 1, including a plurality of positioning means and a plurality of component mounting means.

* * * * *